United States Patent
Satoh

(10) Patent No.: US 6,235,112 B1
(45) Date of Patent: May 22, 2001

(54) APPARATUS AND METHOD FOR FORMING THIN FILM

(75) Inventor: Kiyoshi Satoh, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 09/238,015

(22) Filed: Jan. 26, 1999

(30) Foreign Application Priority Data

Jan. 26, 1998 (JP) ................................................ 10-026378

(51) Int. Cl.[7] .............................. B05B 7/24; B05B 17/06; C23C 16/448; C30B 25/16; H01L 21/443
(52) U.S. Cl. .................... 118/300; 118/326; 118/725; 118/726; 427/248.1; 427/99; 427/124; 427/585; 117/88; 117/102; 438/680
(58) Field of Search ................................. 118/300, 306, 118/730, 725, 726, 313, 326; 427/248.1, 311, 314, 585, 99, 124; 117/88, 100, 102, 109; 438/680

(56) References Cited

U.S. PATENT DOCUMENTS

| | | | |
|---|---|---|---|
| 4,749,440 | * | 6/1988 | Blackwood et al. .................. 156/646 |
| 5,280,012 | * | 1/1994 | Kirlin et al. ............................... 505/1 |
| 5,451,260 | * | 9/1995 | Versteeg et al. ....................... 118/725 |
| 5,620,524 | * | 4/1997 | Fan et al. ............................... 118/726 |
| 6,074,487 | * | 6/2000 | Yoshioka et al. ..................... 118/726 |

* cited by examiner

Primary Examiner—Richard Crispino
Assistant Examiner—J. A. Lorengo
(74) Attorney, Agent, or Firm—Knobbe, Martens, Olson & Bear, LLP

(57) ABSTRACT

An apparatus for forming a thin film such as a silicon oxide film on a surface of a substrate such as a semiconductor substrate includes: a reaction chamber having an interior where the substrate is placed when in use; a liquid reaction material supplier for supplying a given amount of liquid reaction material such as TEOS for forming a thin film on the substrate; and a mist-forming device for forming mist of the liquid reaction material and spraying the liquid reaction material onto a surface of the substrate for forming a thin film thereon. The mist-forming device is disposed upstream of the reaction chamber and downstream of the liquid reaction material supplier. Neither of the mist-forming device nor the liquid reaction material supplier includes a heating device for heating the liquid reaction material.

11 Claims, 4 Drawing Sheets

APPARATUS AND METHOD FOR FORMING THIN FILM

BACKGROUND OF THE INVENTION

This invention relates to an apparatus and a method for forming a thin film on a substrate surface, and particularly to those for vapor-phase deposition of a thin film using a liquid reaction material having a low vapor pressure.

Heretofore, in production processes of semiconductor circuits or liquid crystal circuits, a chemical vapor deposition (CVD) method has been employed for forming various thin films. In the CVD method, plasma excitation energy or thermal energy is exerted onto material gas necessary for forming a film so as to form a thin film on a base plate or substrate. Recently, in view of demands for more integrated semiconductor circuits, as a reaction material, what is used is liquid reaction materials having a low vapor pressure, and which have good characteristics of covering steps and filling in spaces.

A method of introducing the liquid reaction material into a reaction chamber upon vaporization of the material includs a bubbling method wherein the liquid material is vaporized by passing inert gas thereinto, a baking method wherein the liquid material is vaporized directly by heating, a direct vaporization method wherein the liquid material is vaporized by introducing it along with a carrier gas to a heated and pressure-reduced space, an ultrasonic wave method wherein the liquid material is vaporized by heating mist of the material generated by ultrasonic wave vibration, and so forth.

However, by these conventional methods, a constant amount of reaction gas cannot be provided for the reasons below, and further, a large amount of low vapor pressure liquid reaction material cannot be provided, thereby causing drawbacks of decreasing film reproducibility and deposition rate.

That is, in the above bubbling method, in order to maintain the flow of vaporized liquid material at a constant rate, it is necessary to keep the temperature of the liquid material constant. However, the temperature of the liquid material gradually decreases due to the latent heat upon its vaporization by the carrier gas, and thus it is technologically difficult to maintain a temperature constant during the vaporization process.

Further, in the bubbling method and in the direct vaporization method, the amount of carrier gas needs to be increased in order to obtain a large amount of liquid material gas. However, even if the absolute amount of the liquid material gas is increased, the concentration of the liquid material gas is decreased, thereby subsequently reducing the speed of film formation.

In the baking method, in order to obtain a large amount of liquid material gas, it is necessary to heat the liquid material to a high temperature by using a large and expensive heat chamber. However, this method cannot be applied to liquid material which is prone to decompose or deteriorate with heat. Further, it is necessary to heat the entire passage of the liquid material gas in order to prevent re-liquification of the liquid material gas, and thus in view of problems in heat resistance of the devices and the cost of the apparatus, high-temperature operation may be barred to a certain extent.

Additionally, in the ultrasonic wave method, liquid material apt to decompose or deteriorate by heat cannot be used. Further, when liquid material which is difficult to vaporize is used, it is necessary to heat the liquid material for vaporization. In this case, heat resistance of the ultrasonic vibrator becomes an issue.

SUMMARY OF THE INVENTION

The present invention has exploited thin film formation using a low vapor pressure material. An objective of the present invention is to provide an apparatus for forming thin films, which is capable of supplying accurately a constant amount of liquid reaction material. Another objective of the present invention is to provide an apparatus for forming thin films, which is capable of supplying a large amount of liquid reaction material having a low vapor pressure. Still another objective of the present invention is to provide an apparatus for forming thin films, which is capable of using any type of liquid reaction material.

Namely, the present invention is to provide an apparatus for forming a thin film on a surface of a substrate, which apparatus comprises: a reaction chamber having an interior where the substrate is placed when in use; a liquid reaction material supplier for supplying a given amount of liquid reaction material for forming a thin film on the substrate; and a mist-forming device for forming mist of the liquid reaction material and spraying the liquid reaction material onto a surface of the substrate for forming a thin film thereon, said mist-forming device being disposed upstream of the reaction chamber and downstream of the liquid reaction material supplier. In the above, preferably, neither of the mist-forming device nor the liquid reaction material supplier comprises a heating device for heating the liquid reaction material. In the above, the liquid reaction material is in the form of liquid when at normal temperature and under normal pressure.

In the above, preferably, the apparatus further comprises a reaction material gas-supplying device for supplying a reaction material gas at a given flow rate, said reaction material gas-supplying device being connected to the interior of the reaction chamber, said reaction material gas being reactive with the liquid reaction material to form a thin film on the surface of the substrate.

The apparatus according to the present invention can typically be adapted to, but is not limited to, a plasma CVD apparatus and a thermal CVD apparatus.

The apparatus of the present invention is based on a method for forming a thin film on a surface of a substrate placed in an interior of a reaction chamber, which method comprises the steps of: forming mist of liquid reaction material for forming a thin film on the substrate; advancing the mist of liquid reaction material toward a surface of the substrate which has a temperature suitable for forming a thin film with the liquid reaction material; and forming a thin film on the substrate, wherein the mist is vaporized at the surface of the substrate or prior to reaching the surface of the substrate. In the above, preferably, the mist is formed by means of ultrasonic wave vibration. Further, preferably, the method further comprises supplying a reaction material gas being reactive with the liquid reaction material to form the thin film on the surface of the substrate. In this method, heat is not applied to the mist when being formed prior to entering the reaction chamber. After entering the reaction chamber and until reaching the substrate, the mist receives heat, and further, in a thermal CVD, heat continues to be applied to the mist after reaching the substrate.

According to the apparatus and method for forming thin films of the present invention, it is possible to use a large amount of liquid reaction material having a low vapor pressure while maintaining a stable flow, thereby forming thin films having high quality with high reproducibility.

Further, according to the apparatus and method for forming thin films of the present invention, it is possible to eliminate vaporization of liquid reaction material as conventionally conducted, and to use a liquid reaction material which is prone to heat decomposition or deterioration.

Still further, according to the apparatus and method for forming thin films of the present invention, it is possible to eliminate all devices or apparatuses for vaporization, thereby reducing the space for installing the apparatus and reducing the cost of installation.

DETAILED DESCRIPTION OF THE PREFERRED EMBODIMENT

Figure 1:
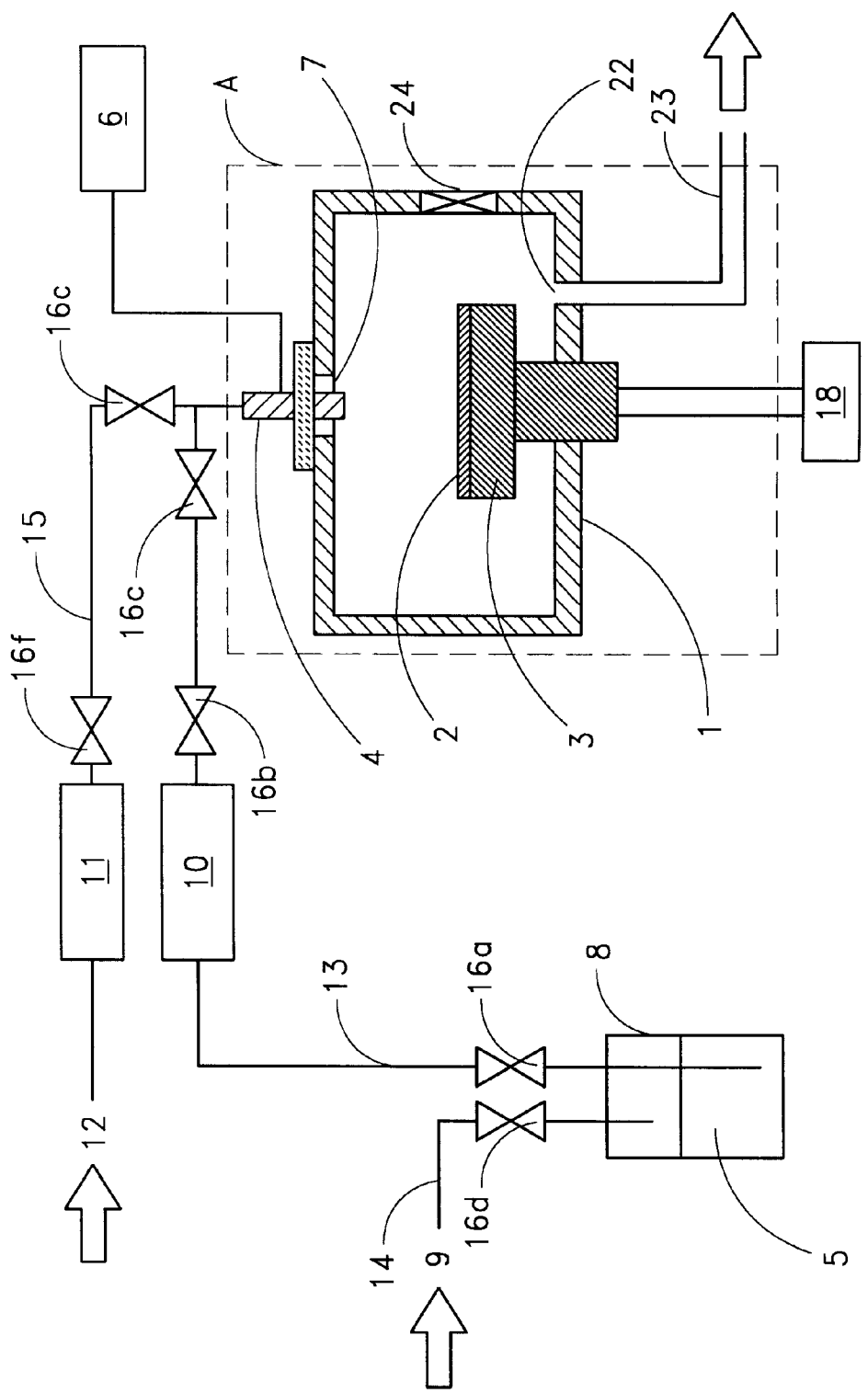
FIG. 1 is a schematic view showing a preferable embodiment of an apparatus for forming a thin film according to the present invention.

One important aspect of the present invention is to provide an apparatus attaining the objectives described above. The apparatus typically comprises elements described below. Namely, the apparatus for forming thin films on a surface of a substrate comprises: a reaction chamber; a liquid reaction material supplier for supplying a given amount of liquid reaction material; and a mist-forming device for forming mist of the liquid reaction material and directly spraying the liquid reaction material onto the surface of the substrate. The mist-forming device is disposed upstream of the reaction chamber and downstream of the supplier. The above apparatus is based essentially on a method comprising the steps of: forming mist of liquid reaction material for forming a thin film on the substrate; advancing the mist of liquid reaction material toward a surface of the substrate which has a temperature suitable for forming a thin film with the liquid reaction material; and forming a thin film on the substrate, wherein the mist is vaporized at the surface of the substrate or prior to reaching the surface of the substrate.

In practice, the liquid reaction material supplier comprises a container for accommodating the liquid reaction material and a flow controller for controlling the liquid flow of the liquid reaction material supplied from the container to the mist-forming device. The mist-forming device can be any device which can spray liquid reaction material such as those comprising an ultrasonic wave vibrator for forming mist of the liquid reaction material, and an ultrasonic wave generator connected to the ultrasonic wave vibrator. Mist-forming devices other than the above include an ultrasonic vibrator. The apparatus may be characterized in that neither of the mist-forming device nor the liquid reaction material supplier comprises a heating device for heating the liquid reaction material.

In the above, the apparatus further comprises a temperature controller for maintaining the substrate at an appropriate temperature for forming a thin film thereon so that the mist is vaporized at the surface of the substrate.

In practice, the apparatus further comprises a purge gas-supplying device for supplying purge gas at a given flow rate for expelling unused liquid reaction material from the mist-forming device. The purge gas-supplying device is disposed upstream of the mist-forming device and connected thereto.

Typically, the apparatus further comprises a reaction material gas-supplying device for supplying a reaction material gas at a given flow rate. The reaction material gas-supplying device is connected to the interior of the reaction chamber. The reaction material gas is reactive with the liquid reaction material to form a thin film on the surface of the substrate.

Further, in practice, the apparatus further comprises a cleaning gas-supplying device for supplying cleaning gas at a given flow rate for removing unwanted products formed in the interior of the reaction chamber upon formation of a thin film on the substrate. The cleaning gas-supplying device is connected to the interior of the reaction chamber. Also, the apparatus further comprises a device for generating a radio-frequency discharge area in the interior of the reaction chamber to form a thin film on the substrate where the mist of the liquid reaction material is sprayed. That is the apparatus includes, but is not limited to, a plasma CVD apparatus, a thermal CVD apparatus, and a photo resist coating apparatus.

In the foregoing, the substrate to be treated can be any type of substrate or wafer, typically for semiconductor wafers. The substrate includes, but is not limited to, a silicon substrate, glass substrate, and ceramic substrate. In the present invention, various types of thin films can be formed. The thin films include, but are not limited to, silicon oxide films, silicon nitride films, SiON films, metal oxide ($Ta_2O_3$, $Ta_2O_5$) films, and metal nitride (WN, TiN) films. The thickness of the films is normally in the range of 2 nm to 5 $\mu$m (preferably 10 nm to 2000 nm). In the present invention, the liquid reaction material includes, but is not limited to, TEOS (tetraethyl orthosilicate, $Si(OC_2H_5)_4$), $SiH(OC_2H_5)_3$, metal organic compounds, and other metal organic compounds. In the above, liquid reaction material having a low vapor pressure (such as 8 Pa or lower) can be used, such as $Ta(OC_2H_5)_5$. The reaction material gas, which is reactive with the liquid reaction material to form a thin film, includes, but is not limited to, ozone ($O_3$)-containing oxygen gas, oxygen gas, $N_2O$, $H_2$, and $NH_3$. The substrate is preferably controlled at a temperature suitable for forming a thin film. Typically, the temperature is in the range of 200° C. to 600° C., depending upon the type of thin film.

EXAMPLES

The present invention will be explained with reference to figures.

FIG. 1 is a schematic view showing a preferable embodiment of an apparatus for forming a thin film according to the present invention. This apparatus comprises a reaction chamber 1, a liquid reaction material supplier for supplying a liquid reaction material 5 at a given flow rate, a mist-forming device 4 connected to an upper portion of the reaction chamber 1, and a purge gas supplier for supplying purge gas at a given flow rate. At the top of the reaction chamber 1, an intake port 7 is disposed for introducing mist of liquid material from the mist-forming device 4, and at the bottom, a discharge port 22 is disposed for discharging spent liquid material to the outside. The discharge port 22 is connected to, via a pipe 23, a device for exhausting gas (not shown) such as an outside vacuum pump. Further, on the side of the reaction chamber 1, an opening with a gate 24 for loading and unloading a semiconductor substrate or wafer is disposed. In the interior of the reaction chamber 1, a semiconductor substrate 2 is placed and a susceptor 3 is disposed for supporting the semiconductor substrate. The susceptor 3 is connected to a temperature controller 18 provided outside, thereby maintaining the substrate 2 at a given temperature.

The liquid reaction material supplier is comprised of a container 8 made of stainless steel, for example, for accommodating the liquid reaction material 5, a liquid flow controller 10 provided in a line 13, and preferably three valves 16a, 16b, and 16c. A line 14, in which a valve 16d and an input port 9 for introducing inert gas such as helium gas for pressure transfer of the liquid reaction material are provided, is connected to a lid of the container 8. When inert gas is introduced from the inlet port 9 to the container 8, the pressure within the interior of the container 8 rises, thereby pushing the liquid reaction material 5 out of the container 8, reaching the liquid flow controller 10 via the valve 16a through the line 13. The liquid reaction material 5, which is controlled at a given flow rate by the liquid flow controller 10, reaches the mist-forming device 4 via the valve 16c. The valves 16a–16d (and valves described below) can be manually operated, electrically driven, or driven by air pressure.

The mist-forming device 4, described in detail later, is connected to an upper portion of the reaction chamber 1, and an ultrasonic wave generator 6 is electrically connected to the mist-forming device 4. By the mist-forming device 4, the liquid reaction material 5 becomes mist, and is sprayed evenly on a surface of the substrate 2.

Preferably, in this embodiment, a purge gas supplier, which is comprised of an inlet port 12, a mass flow controller 11 provided in a line 15, and preferably two valves 16e and 16f, is connected to the mist-forming device 4. After completion of thin film formation, the non-reacted liquid remaining inside the mist-forming device 4 is discharged while the purge gas passes through the mist-forming device 4 via the line 15. The purge gas is controlled at a given flow rate by the mass flow controller 11. In the above, the valves 16e and 16f, the liquid flow controller 10, the mass flow controller 11, the mist-forming device 4, and the temperature controller 18 all can be automatically controlled by a programmed computer.

Figure 2:
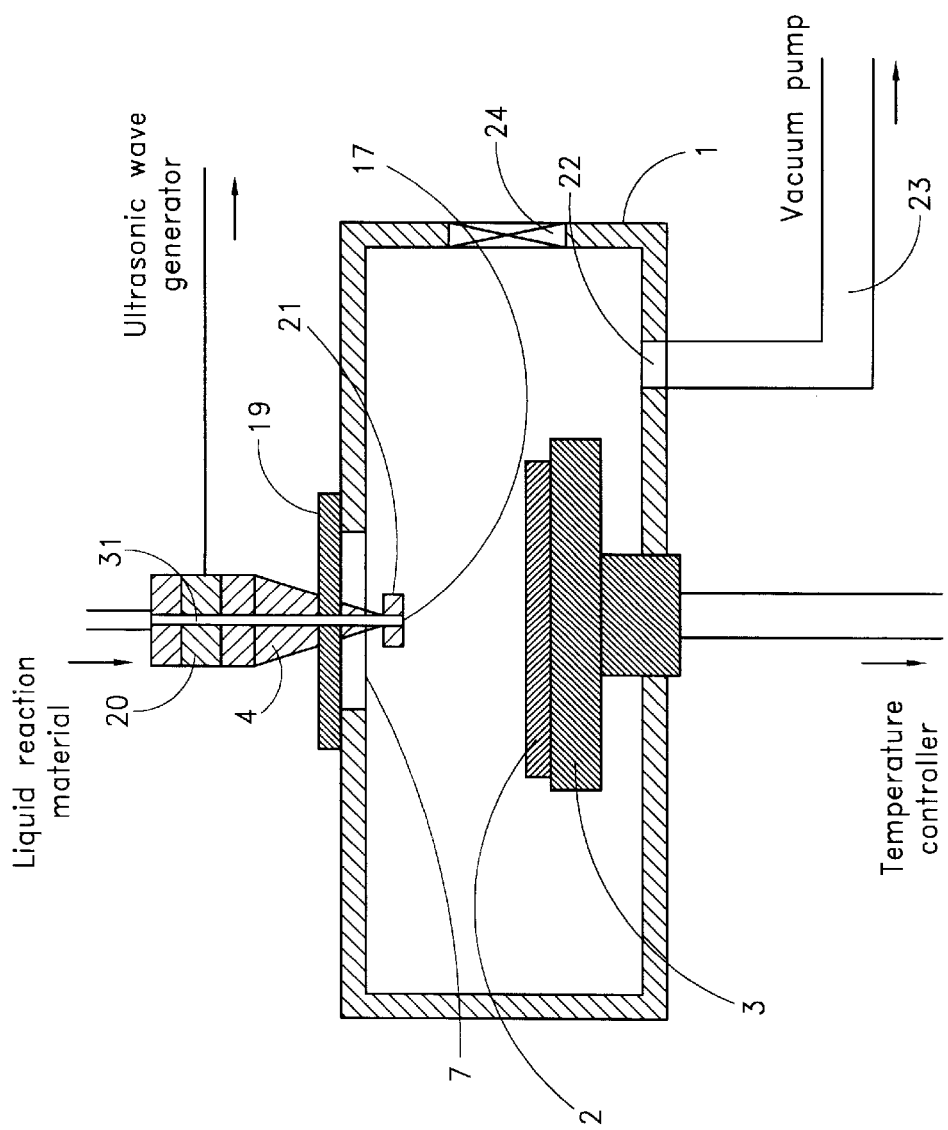
FIG. 2 is an enlarged view of portion A indicated in FIG. 1.

FIG. 2 is an enlarged view of portion A indicated in FIG. 1. The mist-forming device 4 includes a passage 31 aligned on the central axis and an ultrasonic wave vibrator 20 connected to the ultrasonic wave generator 6. The mist-forming device 4 is connected to the reaction chamber 1 via a connection substrate 19. The mist-forming device 4 has a cone-like shape, and in the center of the small end of the cone, a small opening 17 is provided. The diameter of the small opening 17 is determined depending upon the amount of liquid reaction material supplied. Further, the distance between the semiconductor substrate 2 and the small end of the cone 21 is set so as to spray mist of the liquid reaction material 5 evenly on the semiconductor substrate 2. The liquid reaction material 5 whose flow is controlled by the flow controller 10 is made into mist by ultrasonic waves at the small end of the cone 21 by means of vibration generated by the ultrasonic wave vibrator 20. Mist of the liquid reaction material 5 is sprayed evenly on the semiconductor substrate 2, and is vaporized before reaching the surface of the semiconductor substrate heated to a given temperature. Accordingly, because the liquid material is vaporized first at film formation, it is possible to control the flow with high accuracy and concurrently to provide a large amount of the material. Further, it is unnecessary to heat the entire vaporization device prior to film formation.

Figure 3:
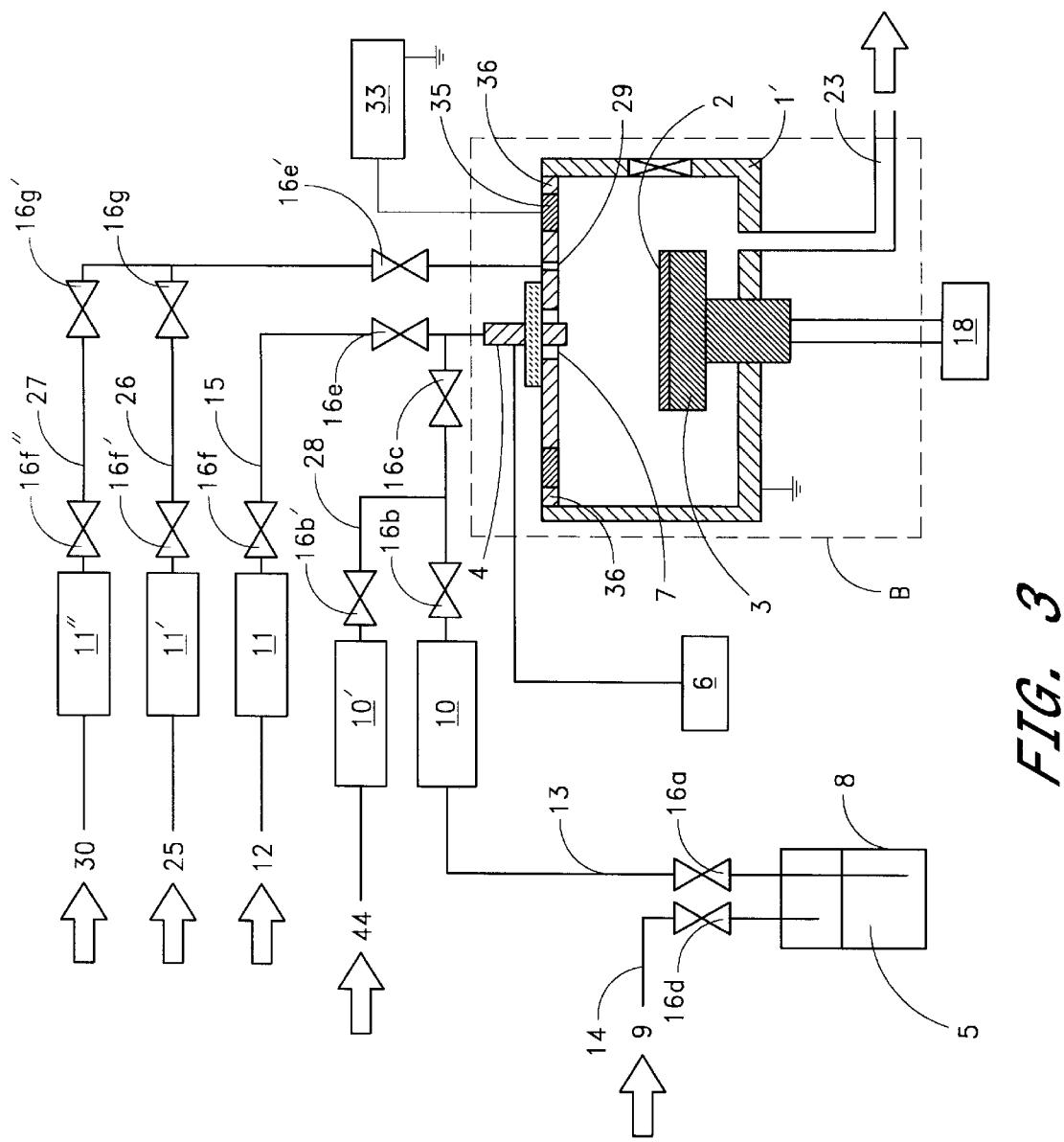
FIG. 3 is a schematic view showing another embodiment of the apparatus for forming thin films according to the present invention.
Figure 4:
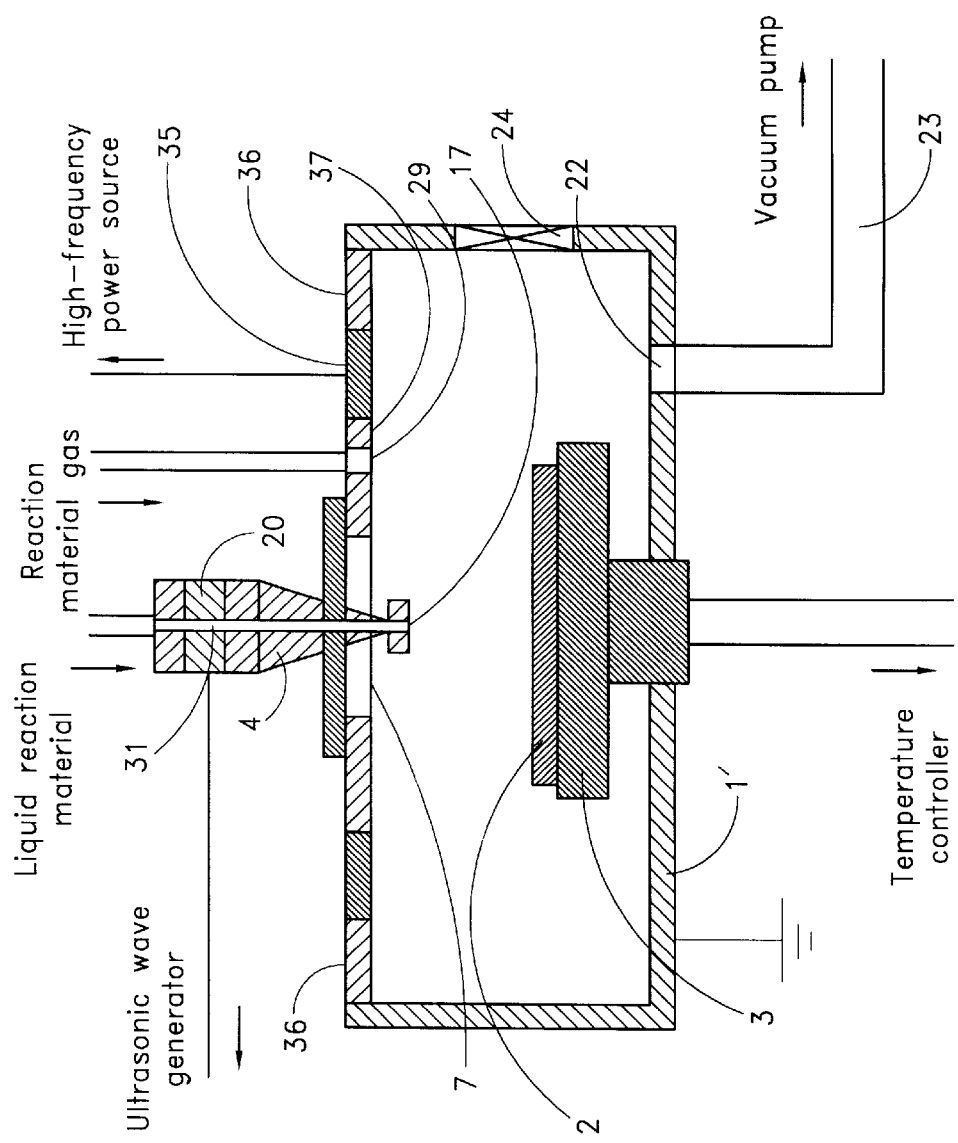
FIG. 4 is an enlarged view of portion B indicated in FIG. 3.

FIG. 3 is a schematic view showing another embodiment of the apparatus for forming thin films according to the present invention. FIG. 4 is an enlarged view of portion B indicated in FIG. 3. In these figures, the same numerals or the same numerals with prime (') or two primes (") as in FIGS. 1 and 2 are used if the functions are the same. The differences from the embodiment indicated in FIGS. 1 and 2 reside in that a reaction material gas-supplying device, a cleaning gas-supplying device, and a diluent solvent supplying device are additionally provided, and further, the reaction chamber is changed to one capable of plasma treatment.

The reaction material gas-supplying device is comprised of an inlet port 30, a mass flow controller 11" provided on the line 27, and preferably three valves 16f', 16g', and 16e'. For example, if a silicon oxide film is formed on a substrate 2, TEOS (tetraethyl orthosilicate, $Si(OC_2H_5)_4$) as a liquid reaction material, and ozone ($O_3$) containing oxygen gas as a reaction material gas, may be used. In the above, ozone-containing oxygen gas introduced from the port 30 is controlled at a given flow rate by the mass flow controller 11", and is then supplied to the interior of the reaction chamber 1' from an intake port 29 via the valve 16e'. The TEOS, which has been made into mist by the mist-forming device 4, and the ozone-containing oxygen gas introduced from the intake port 29, undergo chemical reaction on the substrate 2 which is heated to 400° C. so as to form a silicon oxide film thereon. In the above, TEOS and oxygen ($O_2$) can be used as a liquid reaction material 5 and as reaction material gas, respectively, to form a silicon oxide film. In that embodiment, oxygen gas introduced from the port 30 is also controlled at a given flow rate by the mass flow controller 11", and is then introduced into the interior of the reaction chamber 1' from the intake port 29 via the valves 16f", 16g', and 16e'. TEOS made into mist by the mist-forming device 4 and oxygen gas introduced from the intake port 29 undergo chemical reaction caused by plasma excitation on the substrate 2 which is heated preferably to 350° C. so as to form a silicon oxide film thereon.

Additionally, the apparatus for forming thin films according to the present invention may further include a cleaning gas-supplying device. This cleaning gas-supplying device is comprised of an input port 25, a mass flow controller 11' provided in a line 26, and valves 16f and 16g. The end of the line 26 is connected to the line 27. In the above, the type of cleaning gas to be used varies depending upon the type of liquid reaction material or the type of film formed. For example, for the above silicon oxide film derived from TEOS, fluorine series gas is used. Fluorine series gas is controlled at a given flow rate by the mass flow controller 11', and is then introduced into the interior of the reaction chamber 1' from the intake port 29 via the valve 16e'. Reaction byproducts deposited on an inner wall of the reaction chamber 1' or contaminants formed as a thin film on the susceptor can be removed preferably by plasma etching using fluorine series gas. Cleaning gas other than fluorine series gas includes $C_2F_6+O_2$, $CF_4+O_2$, $NF_3$, $NF_3+He$, $NF_3+Ar$, $NF_3+He+Ar$, and $C_3F_8+O_2$.

Further, the apparatus for forming thin films according to the present invention may also include a diluent solvent-supplying device. This diluent solvent-supplying device is comprised of an input port 44, a liquid flow controller 10' provided in a line 28, and a valve 16b'. The end of the line 28 is connected to the line 13. The diluent solvent-supplying device can be used in order to reduce the viscosity of the liquid reaction material 5 when the viscosity of the liquid reaction material 5 is so high that it is difficult to form mist, or when the diameter of mist particles is high (e.g., 20–50 μm or larger). The type of diluent solvent is selected from those which are inert against film formation reaction. For example, diluent solvent includes alcohol (e.g., $CH_3OH$, $C_2H_5OH$), and organic solvent (e.g., xylene). The liquid reaction material 5 whose flow is controlled by the flow controller 10 is mixed with the diluent solvent whose flow is controlled by the flow controller 10' at a given ratio. The liquid reaction material 5 having an optimal viscosity is provided to the mist-forming device 4 to form mist, and is then sprayed on the surface of the substrate 2.

In the present invention, the apparatus for forming thin films can be adapted for various types of reaction chambers other than those described above. In another embodiment, the reaction chamber can be a reaction chamber for regular thermal CVD, or a treatment chamber for plasma CVD using plasma excitation.

The reaction chamber 1' in FIG. 3 schematically indicates a plasma treatment chamber, and FIG. 4 is an enlarged view of the chamber. In the top portion of the reaction chamber 1', a circular-shaped plate electrode 35 is provided, and the circular-shaped plate electrode 35 is connected using a coaxial cable to a radio-frequency wave generator 33 which generates waves having a frequency of preferably 13.56 MHz. The outer wall of the reaction chamber 1' is grounded, and the electric potential of the inner wall and that of the susceptor 3 are maintained at the same level. The plate electrode 35 and the reaction chamber 1' are electrically insulated by an insulation ring 36. Also, the plate electrode 35 and the mist-forming device 4 are electrically insulated by an insulation flange 37. The end of the line 27 for supplying reaction material gas, into which the line 26 for supplying cleaning gas is merged, is connected to the intake port 29 provided in the insulation flange 37. The interior of the reaction chamber 1' is exhausted by a vacuum pump (not shown). When radio-frequency wave potential is exerted on the plate electrode 35, plasma discharge occurs between the plate electrode 35 and the susceptor 3 and the inner wall of the reaction chamber 1', whereby mist particles of the liquid reaction material 5 in the vicinity of the substrate surface are activated by receiving plasma excitation energy, and undergo chemical reaction, thereby forming a thin film on the substrate surface. According to the apparatus for forming thin films of the present invention, pentaethoxytantalum $(Ta(OC_2H_5)_5)$, which undergoes thermal decomposition at approximately 150° C., and oxygen gas can be used as a liquid reaction material and as a reaction material gas, respectively, to form a thin film of tantalum oxide on the substrate.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. An apparatus for forming a thin film on a surface of a substrate, comprising:

a reaction chamber having an interior where the substrate is placed when in use;

a liquid reaction material supplier for supplying a given amount of liquid reaction material for forming a thin film on the substrate;

a mist-forming device having a nozzle for forming mist of the liquid reaction material onto a surface of the substrate for forming a thin film thereon, said mist-forming device being disposed upstream of the reaction chamber and downstream of the liquid reaction material supplier, said nozzle being exposed to the interior of the reaction chamber right above the center of the substrate;

an electrode disposed around the nozzle wherein the nozzle is insulated from the electrode; and a purge gas-supplying device for supplying purge gas at a given flow rate for expelling unused liquid reaction material from the mist-forming device, said purge gas-supplying device being disposed upstream of the mist-forming device and connected thereto.

2. The apparatus according to claim 1, wherein the liquid reaction material supplier comprises a container for accommodating the liquid reaction material and a flow controller for controlling the liquid flow of the liquid reaction material supplied from the container to the mist-forming device.

3. The apparatus according to claim 1, wherein the mist-forming device comprises an ultrasonic wave vibrator for forming mist of the liquid reaction material, and an ultrasonic wave generator connected to the ultrasonic wave vibrator.

4. The apparatus according to claim 1, further comprising a temperature controller for maintaining the substrate at an appropriate temperature for forming a thin film thereon.

5. The apparatus according to claim 1, further comprising a reaction material gas-supplying device for supplying a reaction material gas at a given flow rate, said reaction material gas-supplying device being connected to the interior of the reaction chamber, said reaction material gas being reactive with the liquid reaction material to form a thin film on the surface of the substrate.

6. The apparatus according to claim 1, further comprising a cleaning gas-supplying device for supplying cleaning gas at a given flow rate for removing unwanted products formed in the interior of the reaction chamber upon formation of a thin film on the substrate, said cleaning gas-supplying device being connected to the interior of the reaction chamber.

7. The apparatus according to claim 1, further comprising a device for generating a radio-frequency discharge area in the interior of the reaction chamber to form a thin film on the substrate where the mist of the liquid reaction material is sprayed.

8. The apparatus according to claim 1, wherein neither of the mist-forming device nor the liquid reaction material supplier comprises a heating device for heating the liquid reaction material.

9. The apparatus according to claim 1, which is a plasma CVD apparatus or a thermal CVD apparatus.

10. An apparatus for forming a thin film on a surface of a substrate, comprising:

a reaction chamber having an interior where the substrate is placed when in use;

a liquid reaction material supplier for supplying a liquid reaction material for forming a thin film on the substrate;

a mist-forming device for forming mist of the liquid reaction material onto a surface of the substrate for forming a thin film thereon, said mist-forming device being disposed on top of the reaction chamber and downstream of the liquid reaction material supplier;

a flow controller for controlling a flow rate of the liquid reaction material, said flow controller being disposed between the liquid reaction material supplier and the mist-forming device;

a diluent solvent-supplier for controlling the viscosity of the liquid reaction material by adding a diluent solvent at a given rate to the liquid reaction material between the flow controller and the mist-forming device; and a purge gas-supplying device for supplying purge gas at a given flow rate for expelling unused liquid reaction material from the mist-forming device, said purge gas-supplying device being disposed upstream of the mist-forming device and connected thereto.

11. The apparatus according to claim 10, further comprising an electrode disposed around the mist-forming device.

* * * * *